United States Patent [19]
Hong

[11] Patent Number: 6,096,605
[45] Date of Patent: Aug. 1, 2000

[54] FABRICATING METHOD OF NON-VOLATILE FLASH MEMORY DEVICE

[75] Inventor: Gary Hong, Hsin-Chu, Taiwan

[73] Assignee: United Semiconductor Corp., Hsinchu, Taiwan

[21] Appl. No.: 09/076,676

[22] Filed: May 12, 1998

[30] Foreign Application Priority Data

Dec. 24, 1997 [TW] Taiwan .................................. 86119672

[51] Int. Cl.[7] ............................................. H01L 21/8247
[52] U.S. Cl. ........................... 438/266; 438/286; 438/529
[58] Field of Search .................................... 438/257, 264, 438/266, 267, 286, 527, 529, 595, 596

[56] References Cited

U.S. PATENT DOCUMENTS

| | | | |
|---|---|---|---|
| 4,852,062 | 7/1989 | Baker et al. .............................. | 438/286 |
| 5,550,073 | 8/1996 | Hong ........................................ | 438/267 |
| 5,614,747 | 3/1997 | Ahn et al. ................................. | 438/267 |
| 5,641,696 | 6/1997 | Takeuchi .................................. | 438/264 |
| 5,930,631 | 7/1999 | Wang et al. .............................. | 438/286 |

*Primary Examiner*—Chandra Chaudhari
*Attorney, Agent, or Firm*—Thomas, Kayden, Horstemeyer & Risley

[57] ABSTRACT

A method of fabricating a non-volatile flash memory device, wherein a gate structure is formed on a substrate. The method includes at least the following steps. The substrate is implanted with first ions to form a source region in the substrate. A tunneling oxide layer is formed on the substrate. A silicon nitride layer is formed on the substrate. The silicon nitride is etched back to form a silicon nitride spacer on the sides of the gate structure. The substrate is implanted with second ions to form a drain region in the substrate. An oxide layer is formed over the substrate and the gate structure. Then, a polysilicon layer is formed on the oxide layer. The gate structure is used as a selection gate, the silicon nitride spacer is used to store electrons, and the polysilicon layer is used as a controlling gate. The flash memory device can free memory cells by from the influences of over-erased effect.

28 Claims, 3 Drawing Sheets

FABRICATING METHOD OF NON-VOLATILE FLASH MEMORY DEVICE

CROSS-REFERENCE TO RELATED APPLICATION

This application claims the priority benefit of Taiwan application serial no. 86119672, filed Dec. 24, 1997, the full disclosure of which is incorporated herein by reference.

BACKGROUND OF THE INVENTION

1. Field of the Invention

The invention relates in general to a fabricating method of a non-volatile memory device, and more particularly to a fabricating method of a split gate non-volatile memory device.

2. Description of the Related Art

The non-volatile memory device is now widely used in electronic devices. For example, it is used for storing structure data, program data, and re-access data. For the programmable nonvolatile memory device, the electrically erasable programmable ROM (EEPROM) is more used and is widely applied in personal computers and other electronic equipment. The conventional EEPROM is a transistor with a floating gate. Even though the EEPROM can be written to, be erased, and store data, it still has the defect of a low accessing rate, whereas the EEPROM with a flash memory device can process at a faster accessing rate nowadays.

FIG. 1 shows a cross-sectional view of a conventional flash memory device. The conventional flash memory mainly comprises a floating gate. Referring to FIG. 1, a tunneling oxide 11 is formed on the p-substrate 10. A floating gate 12 is then formed on the tunneling oxide 11, and a controlling gate 14 is formed on the floating gate 12. A dielectric layer 13 forms between the floating gate 12 and controlling gate 14. On the sides of the floating gate 12 and the controlling gate 14, there are oxide spacers 17 to protect the transistor, and there is a n-type drain region 15 and a source region 16 formed under the surface of the semiconductor substrate 10. The flash memory takes on the nature of Fowler-Nordheim tunneling. For example, when the flash memory stores data, a high voltage, on the order of 12 volts, is applied between the source region 16 and the drain region 15. A high voltage is also applied to the controlling gate 14. Hot electrons generated by the source region 16 will flow from the source region 16 toward the floating gate 12 through the tunneling oxide layer 11 near the drain region 15. By this mechanism, the threshold voltage of the floating gate transistor is raised to store data.

When the data is to be erased, a negative voltage is applied to the controlling gate 14. The electrons trapped in the floating gate 12 will tunnel through the tunneling oxide layer 11 to erase the data, and the floating gate 12 comes back to the uncharged state. In the erasing process, the erasing time is long to ensure the uncharged state of the floating gate 12. If the erasing time takes too long, not only do the electrons trapped in the floating gate 12 reflow, but the electrons belonging to the floating gate 12 are also pulled out. When so many electrons are pulled out, the floating gate 12 will leave many holes, and the transistor becomes a depletion-type transistor. That is to say, even if no voltage source is applied to the controlling gate 14, the transistor is turned on to cause an over-erased effect.

SUMMARY OF THE INVENTION

It is therefore an object of the invention to provide a fabricating method of a split gate non-volatile flash memory device, wherein the conventional floating gate is replaced by a nitride spacer. In accordance with the present invention, a gate structure is used as a selection gate, and a polysilicon layer is used as a controlling gate. By doing so, the invention can benefit the memory cells, freeing them from the influences of the over-erased effect.

The invention achieves the above-identified objects by providing a new method of fabricating a non-volatile flash memory device, wherein a gate structure is formed on a substrate. The method includes at least the following steps. A photoresist layer is formed on the substrate to cover part of the substrate and part of the gate structure. The substrate is implanted with first ions to form a source region in the substrate. The photoresist layer is removed, and a tunneling oxide layer is formed on the substrate. Next, a silicon nitride layer is formed on the substrate. The silicon nitride is etched back to form a silicon nitride spacer on the sides of the gate structure. The substrate is implanted with second ions to form a drain region in the substrate. An oxide layer is formed over the substrate and the gate structure. Then, a polysilicon layer is formed on the oxide layer. Finally, the polysilicon layer, the oxide layer and the silicon nitride layer are defined to complete the structure of the non-volatile memory device.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIGS. 2A to 2E are cross-sectional views showing the process steps of one preferred embodiment of the method for fabricating a non-volatile flash memory device.

First, a silicon substrate 20 is provided as the conventional process shows, wherein the silicon substrate 20 is lightly doped with, for example, boron ions to form a p-substrate. To separate the device region, a local oxidation of silicon (LOCOS) process forms a field oxide or a shallow trench isolation (STI) process forms a device isolation structure.

Figure 1:
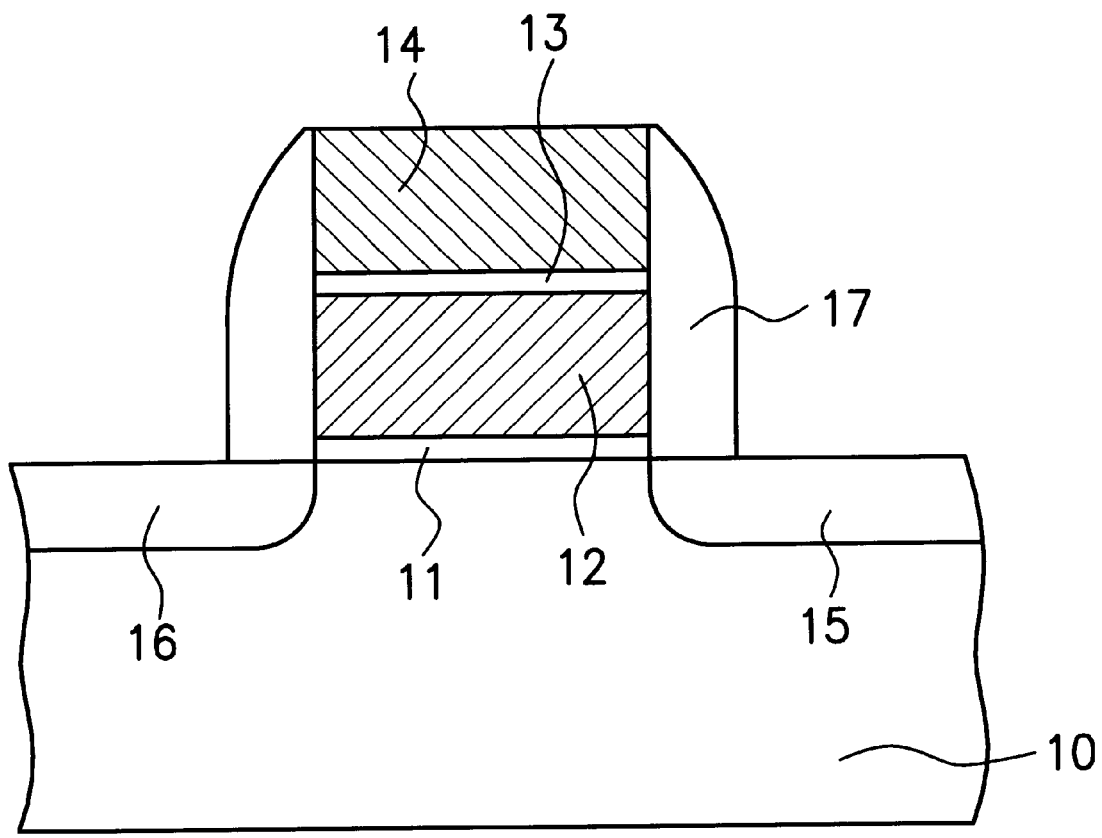
FIG. 1 is a cross-sectional view showing a conventional flash memory device.
Figure 2A:
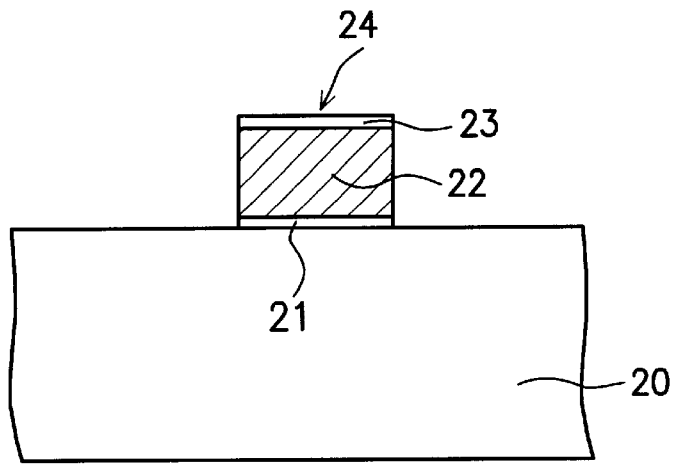
FIGS. 2A to 2E are cross-sectional views showing the process steps of the method for fabricating a non-volatile flash memory device in accordance with a preferred embodiment of the present invention.

Referring first to FIG. 2A, a thin gate oxide layer 21, a polysilicon layer 22, and an oxide layer 23 are grown on the substrate in turn. Then, the gate oxide layer 21, the polysilicon layer 22, and the oxide layer 23 are defined to form a gate structure 24. As shown in FIG. 2A, the thickness of the gate oxide layer 21 is about 50–200 Å, and the gate oxide layer 21 is formed by, for example, thermal oxidation. The polysilicon layer 22 is implanted with dopant to increase its conductivity. The polysilicon layer 22 is implanted with, for example, phosphorus ions at the dosage of about $10^{14}$–$10^{15}$ $cm^{-2}$, and with energy of about 20–50 KeV to form a thickness of about 800–2000 Å. The oxide layer 23 is formed by, for example, chemical vapor deposition (CVD) to a thickness of about 100–1000 Å.

Figure 2B:
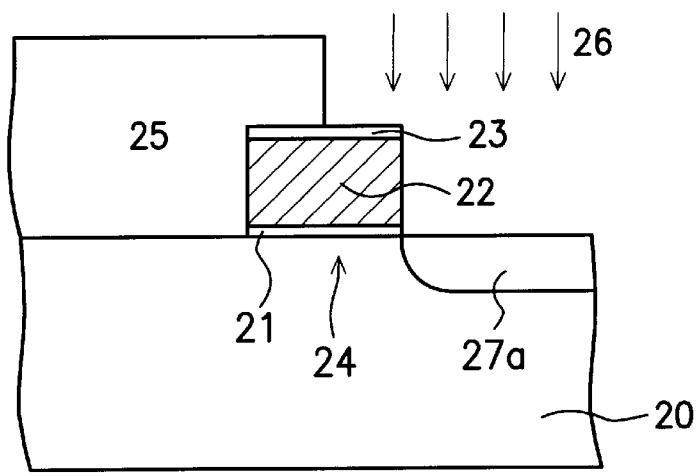

Referring next to FIG. 2B, a mask layer 25 is formed with, for example, photoresist on the substrate 20 to cover part of the substrate 20 and part of the gate structure 24. Then, the uncovered substrate 20 is implanted with first ions 26 to form a source region 27a. The source region 27a is implanted with, for example, arsenic ions at the dosage of about $2\times10^{15}$ cm$^{-2}$, and with an energy of about 50 KeV to form an N-type source region 27a. Afterwards, the mask layer 25 is removed.

Figure 2C:
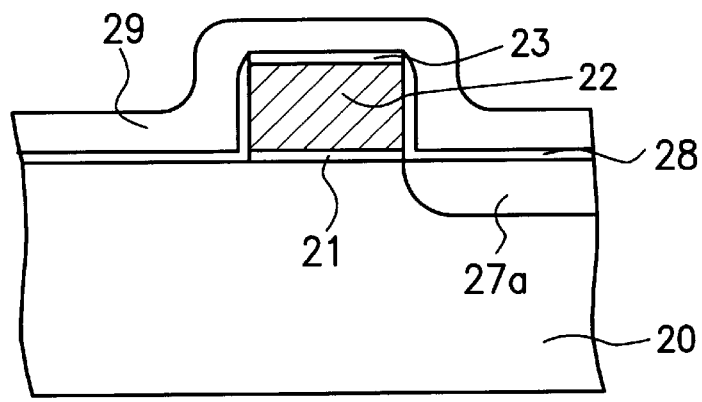

Then, referring to FIG. 2C, a tunneling oxide layer 28 is formed on the substrate 20. A silicon nitride layer 29 is formed on the tunneling oxide layer 28 and over the gate structure 24. Since the hot electrons will tunnel through the tunneling oxide layer 28 when the flash memory device is to be programmed or erased, the tunneling oxide layer 28 is to be thin. The tunneling oxide layer 28 is formed, for example, by thermal oxidation to a thickness of about 50 Å. The silicon nitride layer 29 is formed by CVD to about 500–5000 Å in accordance with the thickness of the silicon nitride spacer formed later.

Figure 2D:
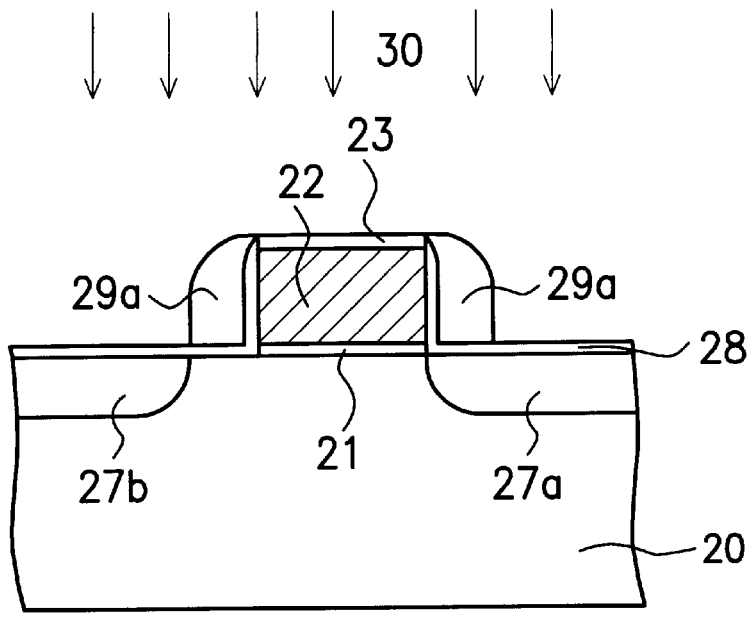

Referring to FIG. 2D, the silicon nitride layer 29 is etched back by, for example, plasma etching to expose the oxide layer 23 of the gate structure 24. Since dry etching is an anisotropic etching process, the silicon nitride layer 29 is etched to form silicon nitride spacers 29a on the sides of the gate structure 24. Then, the substrate 20 is implanted with second ions to form a drain region 27b. The drain region 27b is implanted with, for example, arsenic ions at the dosage of about $10^{15}$ cm$^{-2}$, and with energy of about 30 KeV to form an N-type drain region 27b.

Figure 2E:
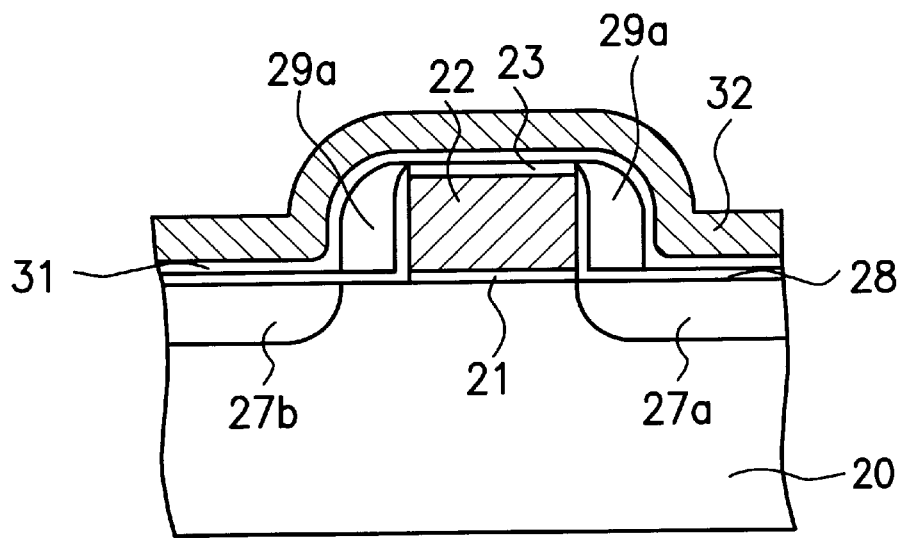

At last, referring to FIG. 2E, an oxide layer 31 is formed on the substrate 20 and the gate structure 24. The oxide layer 31 is formed by, for example, CVD to about 50–200 Å. A polysilicon layer 32 is deposited by CVD procedure on the oxide layer 31 and doped in situ. Then, the polysilicon layer 32, the oxide layer 31, and the silicon nitride spacer 29a are defined to complete the fabrication of the flash memory device. This preferred embodiment of the invention can be processed further, just like the prior art. For example, a passivation layer is formed on the device, a contact window is patterned and etched, and so on.

In accordance with the preferred embodiment of the present invention, the following Table 1 lists the operating voltages for the flash memory device.

TABLE 1

|  | Controlling Gate | Selection Gate | Drain | Source | Substrate |
| --- | --- | --- | --- | --- | --- |
| Program | 10 V | 5 V | 6 V | 0 V | 0 V |
| Erase | −10 V | 0 V | 5 V | 0 V | 0 V |
| Read | 5 V | 5 V | 1 V | 0 V | 0 V |

When the flash memory device is to be programmed, a ground potential is applied to the drain and the substrate. A positive high voltage larger than the threshold voltage of about 6V, for example, 10V, is applied to the controlling gate. Electrons will flow from the channel region under the tunneling oxide layer towards the silicon nitride spacer and finish the programming operation.

When the flash memory device is to be erased, a ground potential is applied to the source, the substrate, and the selection gate, a negative voltage, for example, −10V, is applied to the controlling gate, and a positive voltage, for example, 3V, is applied to the drain. Electrons are induced from the silicon nitride spacer through the drain and finish the erasing operation.

In accordance with this preferred embodiment of the invention, the gate structure is used to select a transistor, the silicon nitride is used to store electrons, and the polysilicon layer is used as a controlling gate. Therefore, the invention can benefit the flash memory device by freeing it from the influences of the over-erased effect.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a non-volatile flash memory device, wherein a gate structure is formed on a substrate, the method comprising at least the following steps of:

forming a mask layer to cover part of the substrate and the gate structure, wherein the gate structure is a selection gate of the flash memory;

implanting the substrate with first ions to form a source region;

removing the mask layer;

forming a tunneling oxide layer on the substrate;

forming a silicon nitride spacer on the sides of the gate structure;

implanting the substrate with second ions to form a drain region;

forming an oxide layer on the gate structure and the substrate; and forming a polysilicon layer on the oxide layer.

2. A method according to claim 1, wherein the mask layer is a photoresist layer.

3. A method according to claim 1, wherein the tunneling oxide layer is formed by thermal oxidation.

4. A method according to claim 3, wherein the thickness of the tunneling oxide layer is about 50 Å.

5. A method according to claim 1, wherein the first ions are arsenic ions, and the source region is N-type.

6. A method according to claim 5, wherein the first ions are implanted with dosage of about $2\times10^{15}$ cm$^{-2}$ and with an energy of about 50 KeV.

7. A method according to claim 1, wherein said step of forming the silicon nitride spacer further comprises:

forming a silicon nitride layer; and etching back the silicon nitride layer to form the silicon nitride spacer on the sides of the gate structure.

8. A method according to claim 7, wherein the thickness of the silicon nitride layer is 500–5000 Å.

9. A method according to claim 1, wherein the second ions are arsenic ions, and the drain region is N-type.

10. A method according to claim 1, wherein the second ions are implanted with dosage of about $10^{15}$ cm$^{-2}$ and with an energy of about 30 KeV.

11. A method according to claim 1, wherein the oxide layer is formed by CVD.

12. A method according to claim 1, wherein the thickness of the oxide layer is 50–200 Å.

13. A method according to claim 1, wherein after said step of forming the polysilicon layer further comprises:

defining the polysilicon layer, the oxide layer, and the silicon nitride spacer.

14. A method according to claim 1, wherein the polysilicon layer is implanted with dopant.

15. A method according to claim 1, wherein the polysilicon layer is a controlling gate.

16. A method of fabricating a non-volatile flash memory device, wherein a gate structure is formed on a substrate, the method comprising at least the following steps of:

(a) forming a mask layer to cover part of the substrate and the gate structure, wherein the gate structure is a selection gate of the flash memory;

(b) implanting the substrate with first ions to form a source region;

(c) removing the mask layer;

(c) forming a tunneling oxide layer on the substrate;

(d) forming a silicon nitride layer on the substrate;

(d) etching back the silicon nitride layer to form a silicon nitride spacer on the sides of the gate structure;

(e) implanting the substrate with second ions to form a drain region;

(f) forming an oxide layer on the gate structure and the substrate; and (g) forming a polysilicon layer on the oxide layer.

17. A method according to claim 16, wherein the tunneling oxide layer is formed by thermal oxidation.

18. A method according to claim 16, wherein the first ions are arsenic ions, and the source region is N-type.

19. A method according to claim 18, wherein the first ions are implanted with dosage of about $2 \times 10^{15}$ cm$^{-2}$ and with an energy of about 50 KeV.

20. A method according to claim 16, wherein the thickness of the silicon nitride layer is 500–5000 Å.

21. A method according to claim 16, wherein the second ions are arsenic ions, and the drain region is N-type.

22. A method according to claim 21, wherein the second ions are implanted with dosage of about $10^{15}$ cm$^{-2}$ and with an energy of about 30 KeV.

23. A method according to claim 16, wherein the oxide layer is formed by CVD.

24. A method according to claim 16, wherein the thickness of the oxide layer is 50–200 Å.

25. A method according to claim 16, wherein after said step of forming the polysilicon layer further comprises:

defining the polysilicon layer, the oxide layer, and the silicon nitride spacer.

26. A method according to claim 16, wherein the polysilicon layer is a controlling gate.

27. A method of fabricating a non-volatile flash memory device, wherein a gate structure is formed on a substrate, the method comprising at least the following steps of:

forming a mask layer to cover part of the substrate and the gate structure;

implanting the substrate with first ions to form a source region;

removing the mask layer;

forming a tunneling oxide layer on the substrate and a sidewall of the gate structure;

forming a silicon nitride spacer on the sides of the gate structure;

implanting the substrate with second ions to form a drain region;

forming an oxide layer on the gate structure and the substrate; and forming a polysilicon layer on the oxide layer.

28. The method of claim 1, wherein the tunneling oxide layer is formed by a thermal oxidation process.

* * * * *